INVENTORS
ANDREW E. BRENNEMANN
GEORGE J. KAHAN
ROBERT T. C. TSUI
BY [signature]
ATTORNEY June 20, 1961 A. E. BRENNEMANN ET AL 2,989,716

SUPERCONDUCTIVE CIRCUITS

Filed Dec. 21, 1959 2 Sheets-Sheet 2

United States Patent Office 2,989,716

Patented June 20, 1961

2,989,716

SUPERCONDUCTIVE CIRCUITS

Andrew E. Brennemann, Poughkeepsie, George J. Kahan, Port Washington, and Robert T. C. Tsui, Ithaca, N.Y., assignors to International Business Machines Corporation, New York, N.Y., a corporation of New York Filed Dec. 21, 1959, Ser. No. 861,038
10 Claims. (Cl. 338—32)

This invention relates to superconductive circuits and more particularly to a method of fabricating superconductive circuits having reproducible characteristics, and circuit elements fabricated by the method.

The phenomenon of superconductivity, that is, the ability of certain materials to exhibit zero resistance to the flow of an electrical current when cooled to a sufficiently low temperature, is employed in the design of various electrical circuits such as, by way of example, amplifiers, oscillators, and logical circuits. In general, each of these superconductive circuits employ a cryotron type device. The cryotron may briefly be described as including a first or gate conductor, the resistance of which, either superconducting or normal, is determined by a second or control conductor. In an article by D. A. Buck which appeared in the Proceedings of the IRE, vol. 44, No. 4, April 1956, at pages 482 through 493, the cryotron is described as consisting of a central wire cooled to a superconductive temperature which functions as the gate conductor. Associated with this gate conductor is a single-layer coil wound about the central wire which functions as the control conductor. Current flow of at least a predetermined value through the control conductor generates a magnetic field which is effective, when applied to the gate conductor, to destroy superconductivity therein, and the gate conductor then exhibits normal electrical resistance. In this manner, the cryotron provides a low cost, low power consuming, reliable circuit element.

In general, dynamic operation of superconductive circuits requires that a current flowing through one or more gate conductors be shifted, either partially or completely, to flow through one or more other gate conductors. It has been shown in the above referenced article, that the time constant of this current shift is directly proportional to the circuit inductance and inversely proportional to the circuit resistance, and for this reason, wire-wound cryotrons are inherently a relatively slow speed device.

Copending application Serial No. 625,512, filed November 30, 1956, on behalf of Richard L. Garwin and assigned to the assignee of this application, discloses an improved cryotron type device which, while maintaining each of the advantages of the wire-wound cryotron, additionally permits high speed operation. These cryotron type devices are fabricated of thin films of superconductive material, a first thin film functions as the gate conductor and a second thin film, insulated from the first, functions as the control conductor. In this manner, the circuit inductance can be reduced by several orders of magnitude and, simultaneously, the circuit resistance can be increased by several orders of magnitude.

The film thickness of these thin film cryotrons is generally about several thousand Angstrom units and for this reason superconductive circuits either simple or complex, may advantageously be fabricated in quantity by the thermal evaporation of the necessary materials in a vacuum. Vacuum deposition of materials has long been employed in fabricating a wide variety of articles, and a summary of the techniques employed is contained in Vacuum Deposition of Thin Films by L. Holland, published in 1958 by John Wiley and Sons, Inc., New York.

It has been found, however, that it is difficult to fabricate thin film superconductive circuits economically in quantity for the reason that the characteristics of thin film cryotrons are not generally reproducible from cryotron to cryotron. This results primarily from the fact that the gate conductor of thin film cryotrons do not always exhibit an abrupt transition between the superconducting and normal resistive state as a function of either the operating temperature or applied magnetic field. As a particular example, tin wire has a transition temperature of 3.73° K. and a transition width of a few millidegrees K., while some samples of thin tin films exhibit a transition width of tens of millidegrees K. and more.

What has been discovered is a novel method of fabricating thin film cryotrons and circuits employing these devices in an economical and efficient manner. Cryotrons fabricated according to the method of the invention exhibit a sharp transition between the superconducting and normal resistance state as a function of either the operating temperature or applied magnetic field and further these transitions are reproducible from cryotron to cryotron. Briefly, the method of the invention includes the steps of vacuum deposition of a superconductive material onto a substrate, the area of deposition being determined by a pattern defining mask, then removing a portion of the edges of the deposit. A superconductive gate conductor fabricated in this manner exhibits a relatively sharp magnetic and temperature transition, independent of whether or not a sharp transition was exhibited prior to the removal of the edges.

The reason for obtaining the reproducible sharp transitions is not completely understood, but it appears to include one or more of the following: removal of a concentration of impurities in the edges of the film, removal of strain in the film edges, and obtaining a film with a more uniform cross-section, each of which is caused by the well known shadowing effect of the pattern mask. The present invention, however, affords a method of obtaining reproducible thin superconductive films wherein commercial vacuum apparatus operating in the range of $10^{-5}$ mm. Hg may be employed with the resultant savings in time and relatively complicated equipment.

An object of the invention is to provide an improved method of fabricating superconductive devices.

Another object of the invention is to provide a thin film superconductive gate conductor having an abrupt transition between the superconducting and normal resistance state.

Still another object of the invention is to provide an improved method of fabricating superconductive devices having reproducible characteristics.

A further object of the invention is to provide an improved method of fabricating thin film cryotrons having a relatively abrupt magnetic and temperature transition.

Yet another object of the invention is to provide a method of fabricating superconductive circuits having reproducible characteristics by vacuum deposition, wherein the vacuum during the evaporation time is approximately $10^{-5}$ mm. Hg.

The foregoing and other objects, features and advantages of the invention will be apparent from the following more particular description of a preferred embodiment of the invention, as illustrated in the accompanying drawings.

Figure 1A:
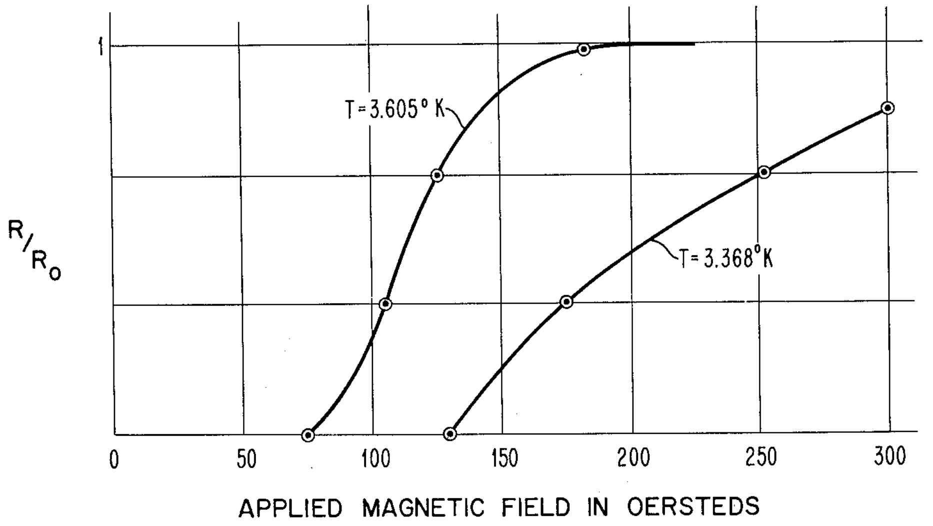
FIG. 1A illustrates the magnetic transitions of a thin film cryotron fabricated by vacuum deposition.

Referring now to the drawings, FIG. 1A illustrates the magnetic transition of the gate conductor of a thin film cryotron at an operating temperature of 3.605° K. as well as an operating temperature of 3.368° K. In the paragraphs to follow, only the magnetic transitions of a gate conductor will be described, it being understood by one skilled in the art that this is the transition generally employed in operating superconductive circuits. Further, an abrupt magnetic transition generally indicates that an abrupt temperature transition will also be obtained although the converse is not necessarily true. This cryotron was fabricated by vacuum deposition of metallic tin upon a glass substrate within a vacuum chamber. The chamber was pumped to about $10^{-5}$ mm. Hg prior to the actual evaporation of the tin, and during the evaporation, the vacuum was maintained below $10^{-4}$ mm. Hg. During the tin deposition time, the evaporation rate was about 15 Angstroms per second and the final thickness of the gate conductor of the cryotron was about 3000 Angstroms. As is shown in FIG. 1A at an operating temperature of 3.605° K., resistance begins to appear at an applied field of 75 oersteds and complete transition to the normal resistance state is evident at about 200 oersteds. Upon lowering the operating temperature to 3.368° K., resistance appears when the applied magnetic field is about 130 oersteds and complete normal resistance is not exhibited even with an applied magnetic field of 300 oersteds. These curves were obtained with the current conducted by the gate held constant at 50 microamperes. The gate current, which is employed to develop an output voltage to indicate the magnitude of the gate resistance, was maintained at the above low value so that the resultant $I^2R$ heating would not effect the transition curve, allowing the curves of FIG. 1A to truly indicate the change in resistance of the gate conductor only as a function of a measurable applied magnetic field.

It should now be understood that the curves illustrated in FIG. 1A, are not ideally suited as the characteristic of a high speed switching cryotron, since a relatively large change in the applied magnetic field is required to effect a transition between the superconducting and normal resistance state. Further, the curves of FIG. 1A are representative of only a single cryotron. Other thin film cryotrons fabricated under apparently similar conditions exhibit the desired abrupt transitions. Still other thin film cryotrons exhibit transitions, at an operating temperature of 3.605° K., that are not complete even when the applied magnetic field exceeds 300 oersteds.

Figure 1B:
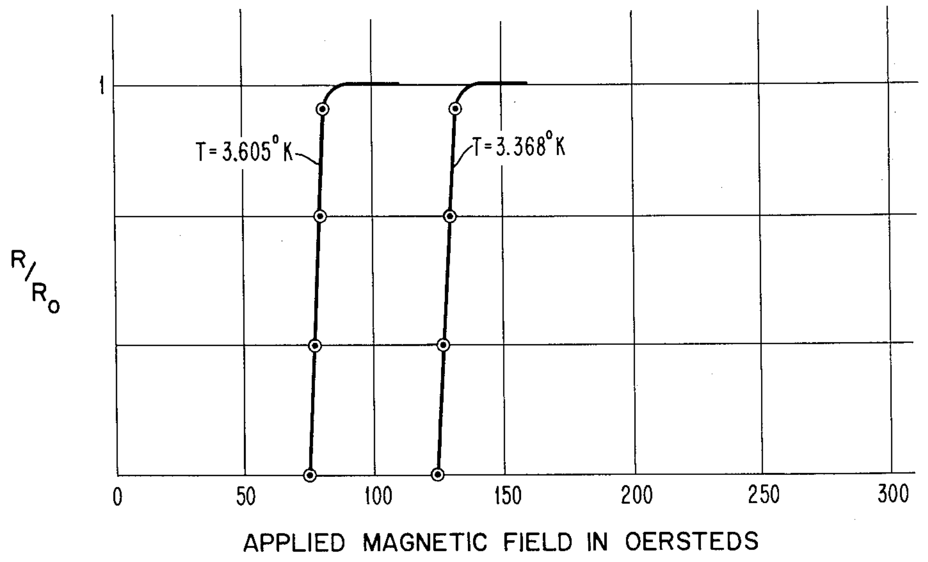
FIG. 1B illustrates the magnetic transitions of the cryotron of FIG. 1A as modified by the method of the invention.

Referring now to FIG. 1B, there is illustrated the transition curves of the cryotron illustrated in FIG. 1A as modified by the method of the invention. As shown therein, at an operating temperature of 3.605° K. resistance appears at an applied magnetic field of 75 oersteds and the transition to the normal resistance state is essentially complete when the applied field is increased by only about 10 oersteds. Again, with the operating temperature reduced to 3.368° K., resistance appears at an applied magnetic field of 125 oersteds, and the transition to the normal resistance state is essentially complete as the applied field is increased by only about 12 oersteds. Further, it should be understood that any of the thin film cryotrons having a wide range of transition curves as discussed above with reference to FIG. 1A, yield essentially the curves illustrated in FIG. 1B when modified by the method of the invention.

In order to convert a cryotron having transition characteristics as illustrated by FIG. 1A into a cryotron having the transition characteristics illustrated by FIG. 1B, a relatively simple yet effective procedure is followed to fabricate a reproducible cryotron. First, a superconductive shield plane consisting of a hard superconductive material is vacuum deposited upon an insulating substrate which may be, by way of example, glass. A hard superconductive material as used in this specification is a material which exhibits superconductivity for all possible values of magnetic fields encountered in an operating superconductive circuit, and when materials such as tin or indium are employed as the soft superconductive materials for the gate conductors, lead and niobium may be advantageously employed as the hard superconductive material. Next an insulating material such as silicon monoxide is vacuum deposited upon the shield, and then metallic tin is deposited thereupon through a pattern mask which defines the geometric configuration required by the gate conductors of the superconductive circuit being fabricated, this tin layer being thereafter operable as the gate conductor. It is desirable to deposit the tin upon the substrate as rapidly as possible to reduce the grain size in the resulting thin film as well as to reduce the number of impurities that adhere to the tin film. At this point in the method, the tin film has an undetermined magnetic transition curve which may be, by way of example, that illustrated in FIG. 1A.

The next step in the method is to remove a portion of each edge of the gate conductor throughout its entire length. It has been found sufficient for improving the transition curve, to remove only about 5% of the width of the gate from each edge. Thus, for a gate conductor having a width of 0.010 inch, removing 0.0005 inch of tin from each edge results in a gate conductor, now having a width of 0.0090 inch, which exhibits the transitions shown in FIG. 1B. The edge removed may be performed by any of the methods well known in the art such as milling, planing, grinding, or the like. Alternately, hand scraping may be employed.

Figure 2:
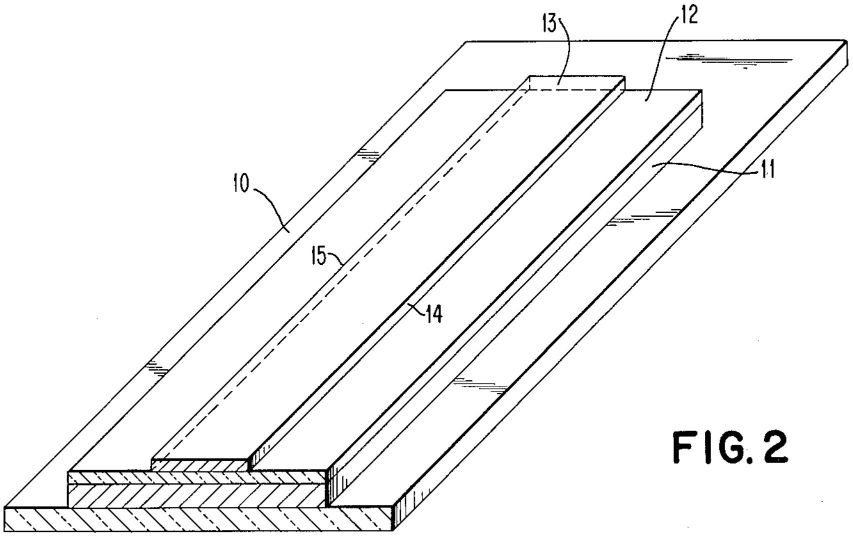
FIG. 2 illustrates a superconductive gate conductor fabricated in accordance with the method of the invention.
Figure 3A:
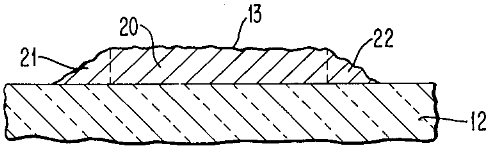
FIG. 3A illustrates a sectional view of a first step in the fabrication of the gate conductor of FIG. 2.
Figure 3B:
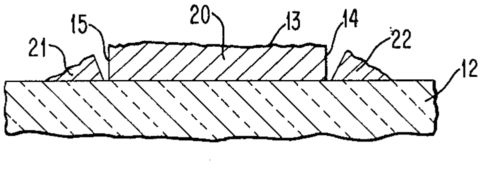
FIG. 3B illustrates a sectional view of a second step in the fabrication of the gate conductor of FIG. 2.

Referring now to FIG. 2, there is shown a gate conductor for a thin film cryotron, fabricated in accordance with the method of the invention. As there shown, a substrate 10 provides support for a superconductive shield plane 11 and a layer of insulating material 12. Deposited upon layer 12 is a gate conductor 13 having sharply defined edges 14 and 15 which are obtained after the edges as deposited, have been removed. More particularly, referring now to FIG. 3A, there is shown, in enlarged detail, a cross-sectional view of the gate conductor 13 as deposited upon layer 12. It can be seen, that layer 13 does not have a uniform cross-section, but rather comprises a center portion 20 of relatively constant thickness, and two end portions 21 and 22 of varying thickness. FIG. 3B illustrates the deposited gate conductor as modified according to the invention. As there shown, end sections 21 and 22 are severed from center portion 20, and electrically isolated therefrom. With the end portions isolated from the center portion, the gate conductor exhibits the transition curves of FIG. 1B. Finally, to obtain the structure illustrated in FIG. 2, end portions 21 and 22 are removed from layer 12.

As an aid in understanding the large improvement in the transition curve of a gate conductor due to the removal of a small quantity of material, consider first the curves of FIG. 1A. The broad transitions, as there shown, are apparently due to variations in the homogeneity of the deposited material, resulting in various portions of the gate conductor having different critical field values. The critical field is defined as the value of applied magnetic field which destroys superconductivity in a particular material. Thus, the curve of FIG. 1A obtained at 3.605° K. tends to indicate that selected regions of the gate have a critical field value of 75 oersteds, other selected regions have a critical field value of 100 oersteds, etc., and all regions of the gate have a critical field value less than 200 oersteds.

These various independent critical field values can be due to several causes. A first cause is variations in the specimen composition resulting from gaseous impurities deposited upon the substrate together with the vaporized tin. From the curves shown in FIG. 1B, which indicate the improvement in transition sharpness due to the removal of the edges of the gate conductor, it appears that the major variation in specimen composition is confined to the extreme edges of the deposited material. It should be understood, however, that a superconducting or nearly superconducting path existing through a gate is sufficient to mask the resistance of the remaining portion of the bulk film, when small values of gate currents are employed.

A second cause of the various independent critical field values is the stress introduced in the deposited material as the particles forming the film condense during the evaporation process. It is well known in the superconductive art that pressure and tension are effective to raise and lower the critical field value of a superconductive material. Again, a comparison between FIGS. 1A and 1B indicates that the major variations in the stresses in the deposited film are confined to the edges. Finally, a third cause of the various independent critical field values is variations in the thickness of the deposited film as a function of the width, and since the edges of the deposited film are thinner than the remainder of the material, due to shadowing and mobility of the deposited particles, a more uniform cross-sectional area is obtained as a result of the edge removal.

The final steps in fabricating a reproducible cryotron according to the method of the invention include vacuum depositing a second insulating layer upon the substrate, depositing a hard superconductive material through a second pattern mask which defines the geometric configuration required by the control conductors of the superconductive circuit being fabricated, and finally depositing a protective coating over the superconductive circuit.

While the apparatus required for vacuum deposition of thin films has neither been shown nor described, it should be understood by those skilled in the art that any of those commercially available may be employed. Further, an apparatus particularly adapted to fabricate a plurality of superconductive circuits during a single evacuation of the vacuum chamber is shown in copending application Serial 839,219, filed September 10, 1959 on behalf of N. Theodoseau et al., and assigned to the assignee of this application.

While the invention has been particularly shown and described with reference to a preferred embodiment thereof, it will be understood by those skilled in the art that various changes in form and details may be made therein without departing from the spirit and scope of the invention.

What is claimed is:

1. The method of fabricating a thin film superconductive gate conductor having relatively abrupt magnetic and temperature transitions between the superconducting and normal resistance states comprising the steps of; vacuum depositing a superconductive material through a pattern defining mask into a substrate in a predetermined pattern; and severing the lateral edges of said pattern, the severed edges being thereafter electrically isolated from the remaining portion of said pattern whereby the transitions between the superconducting and normal resistance states when said gate conductor is operated at a superconductive temperature is independent of the transitions exhibited by said severed edges.

2. The method of fabricating a thin film superconductive gate conductor having relatively abrupt magnetic and temperature transitions between the superconductive and normal resistance states comprising the steps of; vacuum depositing a narrow strip of superconductive material through a pattern defining mask onto a substrate within a vacuum chamber wherein the pressure is maintained at about $10^{-5}$ mm. Hg; and severing about 5% of the superconductive material from each edge of said deposited strip; the severed edges being electrically isolated from the remaining portion of said strip, whereby said transitions of said gate conductor when operated at a superconductive temperature is independent of the transitions exhibited by said severed edges.

3. The method of claim 2 wherein said superconductive material is tin.

4. The method of fabricating a thin film cryotron having a relatively abrupt transition between the superconducting and normal resistance states comprising the steps of; vacuum depositing a first superconductive material through a first pattern defining mask onto a substrate in a predetermined pattern; removing the lateral edges of said pattern; and vacuum depositing a second superconductive material through a second pattern defining mask in spaced relationship with said first superconductive material.

5. In the method of fabricating a thin film superconductive circuit operable at a superconductive temperature, having a superconductive gate conductor and a control conductor, by means of the thermal evaporation of various materials through various pattern defining masks which define the geometry of said circuit onto a substrate within a vacuum chamber having a pressure therein of about $10^{-5}$ mm. Hg, the improvement consisting of mechanically removing about 5% of the edges of said superconductive gate conductor to obtain a relatively abrupt magnetic transition between the superconducting and normal resistance states in said gate conductor.

6. The method of fabricating a thin film superconductive circuit comprising the steps of; vacuum depositing a hard superconductive material upon a substrate; vacuum depositing a first layer of insulating material upon said substrate; vacuum depositing a soft superconductive material upon said substrate through a first pattern mask which defines the geometric configuration of the gate conductor of said superconductive circuit; removing a portion of the lateral edges of said gate conductor to ensure that said deposited gate conductor exhibits essentially an abrupt magnetic transition characteristic between the superconducting and normal resistance states; vacuum depositing a second layer of insulating material upon said substrate; and vacuum depositing a hard superconductive material through a second pattern mask which defines the geometric configuration of the control conductor of said superconductive circuit.

7. A superconductive circuit element comprising; a thin film of superconductive material formed by depositing said material through a pattern mask onto a substrate within a vacuum chamber; said film as deposited including a center portion of first thickness and a pair of edge portions of different thickness; said edge portion being severed from said center portions, whereby the transition characteristic of said circuit element is determined by the transition characteristic of said center portion.

8. A superconductive circuit element comprising; a thin film of superconductive material formed by depositing said material through a pattern mask which defines the geometry of said circuit element onto a substrate within a vacuum chamber; said film as deposited including a center portion of relatively uniform thickness and a pair of edge portions of varying thickness; and said edge portions being electrically isolated from said center portion, whereby the transition characteristic of said circuit element between the superconducting and resistance states when said element is operated at a superconductive temperature is determined by the transition characteristic of said center portion.

9. A superconductive circuit element operable at a superconductive temperature consisting of a thin film of superconductive material formed by depositing said material through a pattern defining mask onto a substrate within a vacuum chamber, said film as deposited including a center portion having a relatively uniform composition and a pair of edge portions having a relatively non-uniform composition, said edge portions of said circuit element being electrically severed from said center portion, said circuit element thereby exhibiting an abrupt magnetic transition between the superconducting and normal resistance state independent of the magnetic transitions exhibited by said edge portions.

10. The method of fabricating a thin film superconductive circuit element which exhibits relatively abrupt and reproducible magnetic and temperature transitions between the superconducting and normal resistance states when said element is operated at a superconductive temperature, which method comprises the steps of; vacuum depositing a superconductive material through a pattern defining mask onto a planar substrate to establish a predetermined thin film geometric configuration of said superconductive material on said substrate; and thereafter severing the lateral edges of said deposited configuration to electrically isolate said edges from the remaining portion of said geometric pattern of superconductive material; said severing step being effective only to stabilize the electrical characteristics of said configuration without materially altering the geometric pattern thereof.

References Cited in the file of this patent

UNITED STATES PATENTS

| | | |
|---|---|---|
| 2,832,897 | Buck | Apr. 29, 1958 |
| 2,849,583 | Pritikin | Aug. 26, 1958 |